United States Patent
Gandhi et al.

(10) Patent No.: US 7,595,688 B2
(45) Date of Patent: Sep. 29, 2009

(54) HIGH POWER COMMUTATING MULTIPLE OUTPUT AMPLIFIER SYSTEM

(75) Inventors: Chetan Gandhi, Cerritos, CA (US); Stan W. Livingston, Fullerton, CA (US); Reinhardt W. Krueger, Anaheim, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 11/981,159

(22) Filed: Oct. 31, 2007

(65) Prior Publication Data

US 2009/0108930 A1    Apr. 30, 2009

(51) Int. Cl.
*H03F 3/68* (2006.01)
(52) U.S. Cl. .................................. 330/124 R; 330/295
(58) Field of Classification Search ............. 330/124 R, 330/295, 84, 126
See application file for complete search history.

(56) References Cited

U.S. PATENT DOCUMENTS

| | | | |
|---|---|---|---|
| 3,255,450 A | 6/1966 | Butler | |
| 4,638,317 A | 1/1987 | Evans | |
| 4,812,788 A | 3/1989 | Wong et al. | |
| 5,302,914 A * | 4/1994 | Arntz et al. | 330/129 |
| 6,294,956 B1 * | 9/2001 | Ghanadan et al. | 330/124 R |
| 7,042,283 B2 * | 5/2006 | Suzuki et al. | 330/52 |

* cited by examiner

*Primary Examiner*—Henry K Choe
(74) *Attorney, Agent, or Firm*—Pillsbury Winthrop Shaw Pittman LLP

(57) ABSTRACT

An amplifier system includes a power divider for dividing an input RF signal into M RF signals of equal power and phase. The system has M low power selectable phase shifters each for phase shifting one of the M RF signals. M high power amplifiers are coupled to respective ones of the phase shifters. The system includes an M×N power distribution network having M input ports and N output ports, such as a Butler matrix. The M high power amplifiers are connected to a respective one of the M input ports of the distribution network. The phase of the M phase shifters may be adjusted to obtain a maximum output at the desired output with all the other outputs nulled.

19 Claims, 4 Drawing Sheets

| Ports | A | B | C | D |
|---|---|---|---|---|
| 1 | 135° | 45° | 90° | 0° |
| 2 | 45° | -45° | -180° | 90° |
| 3 | 90° | -180° | -45° | 45° |
| 4 | 0° | 90° | 45° | 135° |

HIGH POWER COMMUTATING MULTIPLE OUTPUT AMPLIFIER SYSTEM

BACKGROUND

Several methods have been used to provide selectable outputs on a high power transmitter. All use a switch circuit or device to select the output. Mechanical switches are limited by reliability and speed. PIN diode switches add significant loss and weight. Ferrite switches add loss, weight and driver complexity.

Signal distribution networks such as Butler matrices are well known in the art, and examples are described, e.g. in U.S. Pat. No. 3,255,450, which describes a binary network matrix, and U.S. Pat. No. 4,638,317, which describes a matrix with a non-binary set of outputs.

SUMMARY OF THE DISCLOSURE

An exemplary embodiment of an amplifier system includes a power divider for dividing an input RF signal into M RF signals of equal power and phase. An exemplary embodiment of the system has M low power selectable phase shifters each for phase shifting one of the M RF signals. M high power amplifiers are coupled to respective ones of the phase shifters. An exemplary embodiment includes an M×N power distribution network having M input ports and N output ports, such as a Butler matrix. The M high power amplifiers are connected to a respective one of the M input ports of the distribution network. The phase of the M phase shifters may be adjusted to obtain a maximum output at the desired output with all the other outputs nulled.

BRIEF DESCRIPTION OF THE DRAWINGS

Features and advantages of the disclosure will readily be appreciated by persons skilled in the art from the following detailed description when read in conjunction with the drawing wherein.

DETAILED DESCRIPTION

Figure 1:
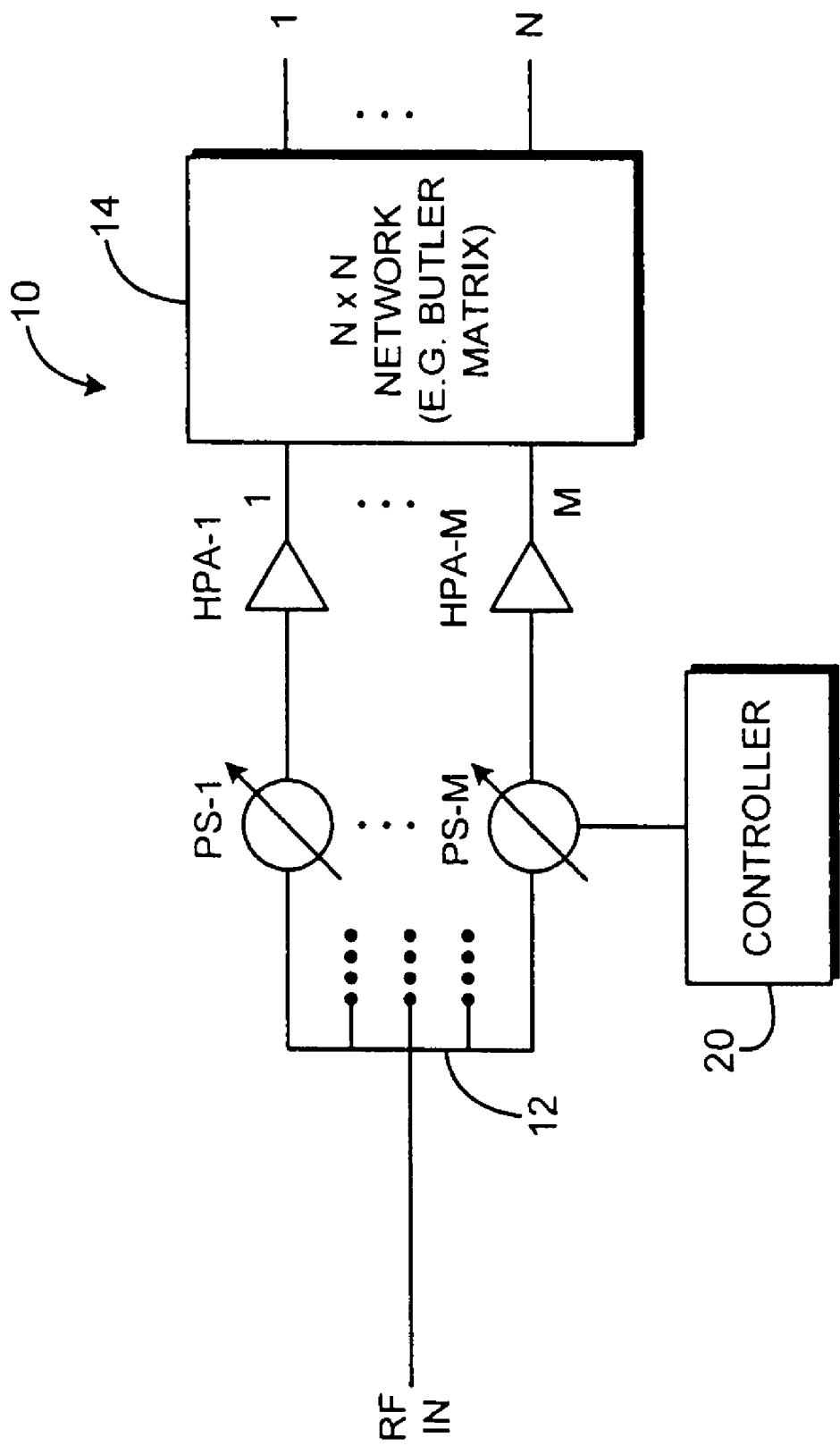
FIG. 1 is a schematic block diagram of an exemplary embodiment of a high power transmitter system with multiple selectable outputs.

In the following detailed description and in the several figures of the drawing, like elements are identified with like reference numerals. The figures are not to scale, and relative feature sizes may be exaggerated for illustrative purposes.

A high power amplifier system with integrated switching to provide selectable outputs is described. In an exemplary embodiment, a system includes low power phase shifters, prior to high power amplification to adjust the phase of a high power amplifier building block (e.g. a solid state amplifier, or a traveling wave tube amplifier, or "TWTA"). The outputs of these building block amplifiers are fed into a distribution network such as a Butler matrix. The phase of each of the individual building block amplifiers may be adjusted to obtain maximum output at the desired output and null all the other outputs, i.e., have little or no output. An exemplary embodiment of an amplifier system may provide the ability to switch high power microwave signals (e.g., kilo-watt or mega-watt) levels with relatively low loss. The isolation at the other three ports may be limited by the phase error and tracking of all components. The phase shifters may be adjusted across the frequency band of interest to compensate for these errors.

A butler matrix traditionally has been used to transform signals obtained from an N-port antenna into M signals used for antenna beam forming. A butler matrix is used with a transmitting system typically as an antenna beam-forming network by incorporating a combination of hybrids and fixed phase shifters with M×N inputs and outputs respectively, with N=M. The butler matrix typically has the property that a signal incident at each input port M provides equal amplitude signals at all N output ports. An transmit implementation of a butler matrix can be used to couple signals to an N-port antenna for example, from mode signals used for forming M multiple beam channels. In these cases all N ports of the output of the transmit network are always excited, simultaneously, while only one individual input port M of the matrix on the input side is to be selected for a particular channel or function. The design of a butler matrix was first explained by J. Butler and R. Lowe, "Beam-forming Matrix Simplifies Design of Electrically Scanned Antennas," Electronic Design, April 1961.

In an exemplary embodiment, the butler matrix may be used as part of a transmitter, but the matrix is reversed so as to excite all M input ports simultaneously, with only one of N output ports to be available for output from the transmitter. The M input ports may be excited by power splitting an input excitation signal M ways. Thus, an exemplary embodiment employs a reversed butler matrix so that, while all the input ports are excited simultaneously, only one individual port of the butler matrix on the output side (which may be connected to an element such as an antenna element) is to be selected for a particular function. This may act as a switch, thus enabling only one of the N outputs to be activated on while the others are isolated off.

FIG. 1 is a schematic block diagram illustrating an exemplary embodiment of a high power amplifier system with selectable outputs. In this exemplary embodiment, an RF input signal is provided to an input port of a power divider circuit 12, which divides the input RF signal into M signals of equal power and phase. The RF input signal is preferably of relatively low or low power. Each of the M signals is passed through a variable phase shifter, PS-1, . . . PS-N and then amplified by a high power amplifier (HPA), HPA-1 . . . HPA-N. The amplified signals are then input into respective input ports of an M×N signal distribution network 14, such as a butler matrix. A controller 20 electronically controls the settings of the phase shifters. By adjusting the phase shifts at the respective phase shifters PS-1 . . . PS-M, the power at a selected one of the N output ports of the network 14 may be maximized, and the power at the other of the N output ports of the network 14 may be nulled.

Figure 2:
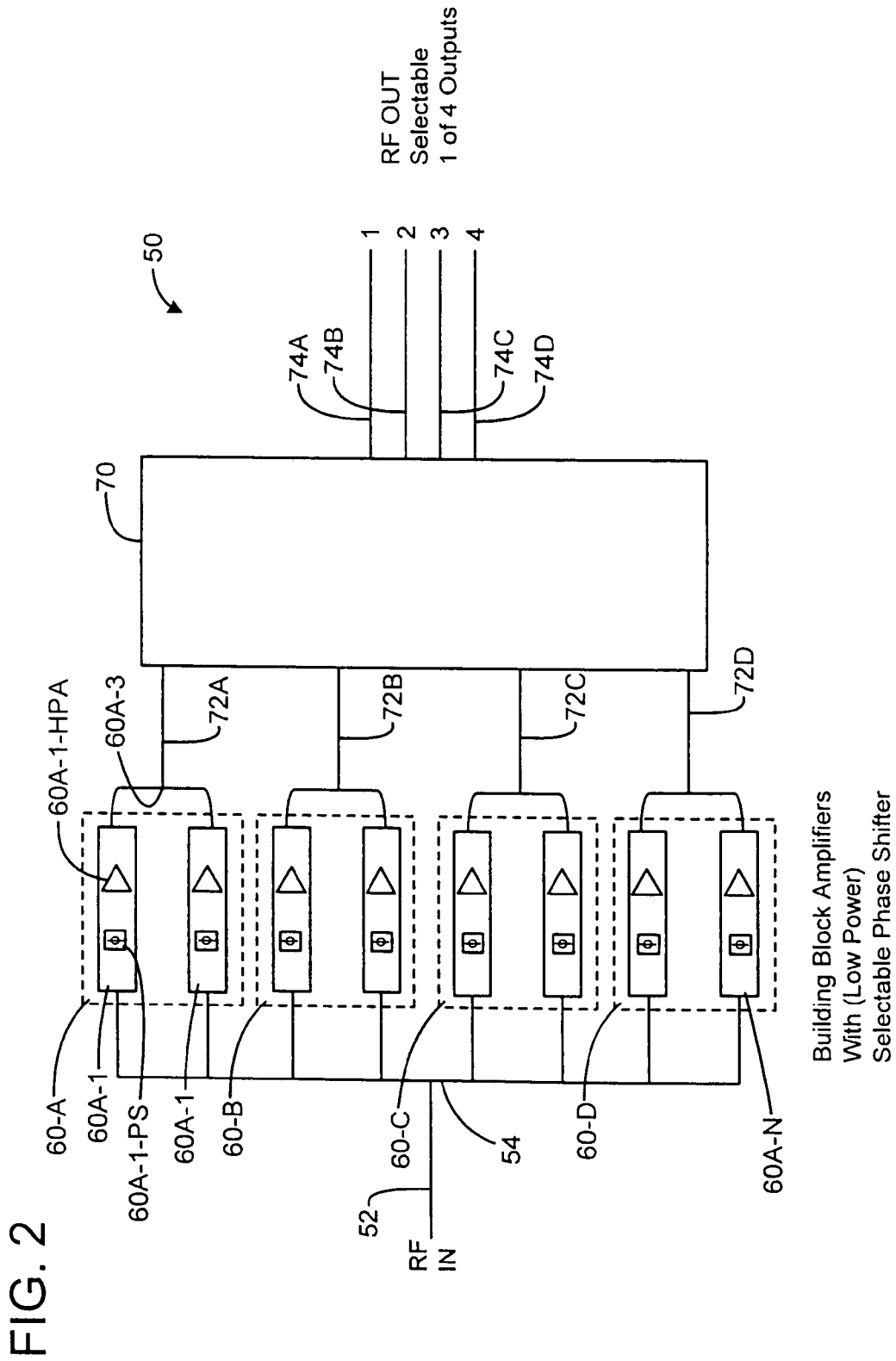
FIG. 2 is a schematic block diagram of an exemplary embodiment of a high power amplifier system.

FIG. 2 is a schematic block diagram of an exemplary embodiment of a high power amplifier system 50. This exemplary embodiment includes eight solid state amplifier microwave integrated circuits (MICs) 60A-1, . . . 60A-N. Two of these amplifiers are combined to form a single building block amplifier circuit, i.e. circuits 60A, 60B, 60C and 60D. Each output of these four circuits is fed into an input port 72A, 72B, 72C, 72D of a 4×4 butler matrix 70. The MIC circuits are excited by an RF signal input at input port 52, and split 8 ways to provide an input to each of the eight MICs 60A-1 . . . 60A-N. Each building block amplifier circuit includes a phase shifter and a HPA. For example, amplifier circuit 60A-1 includes an adjustable phase shifter 60A-1PS and a high power amplifier 60A-1HPA. Each phase shifter may be a miniaturized MIC (MMIC). The MMIC phase shifters may be integrated into the Microwave integrated circuit to provide the phase control to select one of the output ports 74A, 74B, 74C, 74D of the butler matrix 70. The phase shifters can be integrated with the HPA into a single IC in an exemplary embodiment, and in other embodiments the phase shifters and HPA may be fabricated as separate circuits. In an exemplary embodiment in which the phase shifter MMICs and the HPA are integrated into a MIC (Microwave integrated circuit), the MIC is in essence a phase shifting HPA. The combination of low power phase shifter MMICs with HPA MMICs with the butler matrix and an input power splitter performs the functions of both a power combiner and commuting switch. The combined output power may be the sum of all the HPAs minus the butler matrix loss. In an exemplary embodiment, the power can be switched at very high speeds (ns) by adjusting the MMIC phase shifters.

In the exemplary embodiment of FIG. 2, the phase shifter circuitry (inside the MIC) is before the high power amplification. Thus the phase shifter circuitry may not be rated for high power, and its insertion loss may not significantly impact amplifier performance. For example, known, standard MMIC lower power (milli-watt) phase shifters may be used in an exemplary embodiment. These components are readily available at relatively low cost. High speed switching (microseconds) may be easily obtained using standard digital control circuitry. Very high speed switching (nano-seconds) may be obtained using high speed drivers, e.g. in the controller 20.

Figures 3A, 3B:
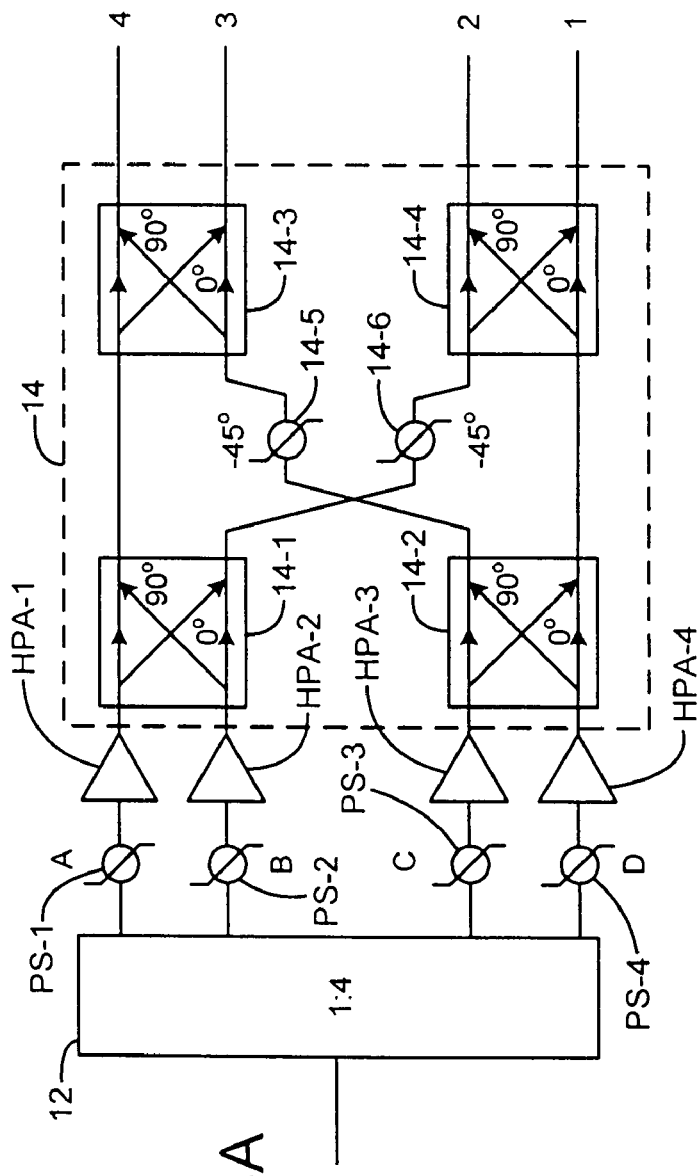
FIG. 3A depicts a schematic block diagram of an exemplary embodiment of a high power transmitter system employing a 4×4 butler matrix.
FIG. 3B is a table of exemplary phase shifter settings for the system of FIG. 3A

FIG. 3A depicts a schematic diagram of an exemplary embodiment of a high power, multiple output commutating high power commutating multiple output amplifier system. The system includes an input power splitter 12 which divides an input signal into four output signals, low power phase shifters PS-1, PS-2, PS-3, PS-4, series connected to respective high power amplifiers HPA-1, HPA-2, HPA-3, HPA-4, connected to respective input ports A, B, C, D of a butler matrix 14. The butler matrix has four output ports 1, 2, 3, 4. The butler matrix 14 includes four 3 dB hybrid couplers 14-1 . . . 14-4 and two respective fixed (−45°) phase shifters 14-5, 14-6, connected as illustrated in FIG. 3A. The butler matrix 14 shown in FIG. 3A is a passive component, and can be fabricated in waveguide, for example, to provide high power capacity. It may be fabricated using top wall or side wall couplers or a variety of other ways. An exemplary waveguide butler matrix is described in U.S. Pat. No. 4,812, 788. Other butler matrices can be fabricated more compactly using stripline, microstrip or coaxial transmission medium, with the tradeoff of lower power handing than waveguide.

FIG. 3B is a table which shows the phase shifter settings for the variable phase shifters to output the combined output power at respective ones of the matrix output ports 1, 2, 3, 4, for the exemplary embodiment of FIG. 3A. In this exemplary embodiment, the phase shifter PS-1 has four phase settings, i.e. 0°, 45°, 90° and 135°. PS-2 has four phase settings, i.e. 45°−45°, −180° and 90° PS-3 has four phase settings, i.e. 90°, −180°−45° and 45°. PS-4 has four phase settings, i.e. 0°, 90°, 45° and 135°.

The use of a waveguide signal distribution network provides a relatively low loss structure. For an exemplary S-Band application, the loss is expected to be less than 0.15 dB over a 10% BW. The expected loss due to phase mismatch errors for narrow bandwidth applications is less than 0.2 dB. The total effective switch loss may be less than 0.35 dB. This is comparable loss to waveguide mechanical switches but without the inherent defects of reliability and slow switching speeds (milli-seconds). This expected loss is far lower than high power solid state switches using pin-diodes. At kilowatt peak power levels the expected loss of a pin-diode switch is around 1 dB. Additionally high power (kilo-watt) diode switches require very high voltage back bias ranging from 100's to 1000's of volts. At high power levels (mega-watts) the problems associated with diode switches only get worse and performance degrades.

Figure 4:
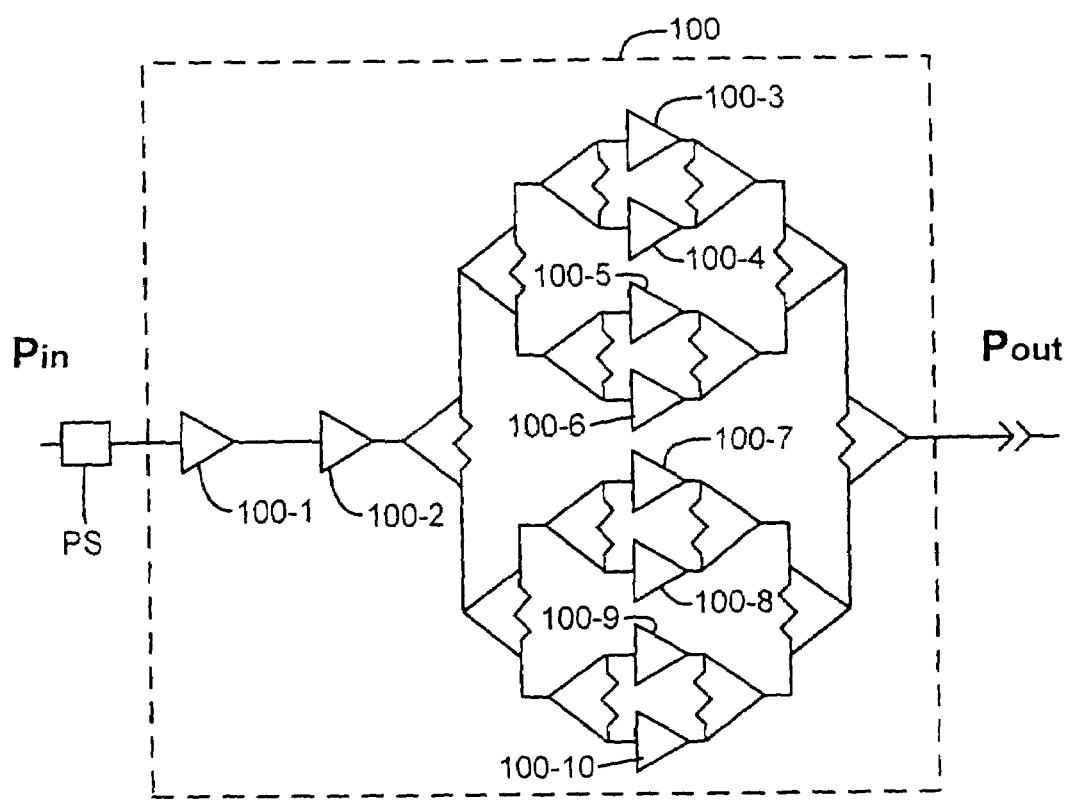
FIG. 4 is a schematic diagram of an exemplary building block amplifier circuit for use in a high power transmitter system.

FIG. 4 is a schematic diagram of an exemplary embodiment of a building block amplifier (MIC) circuit 100 which may be utilized as the high power amplifiers, e.g. HPA-1 . . . HPA-N in FIG. 1. In an exemplary embodiment, the circuit 100 may operate with 10 dBm input power and 1 kW output power in S-Band. This block diagram shows an exemplary implementation of a solid state amplifier that combines eight 120 Watt HPAs 100-3 . . . 100-10, which may be 40 Watt HPA MMIC circuits. The circuit 100 further includes a 1 Watt driver amplifier circuit 100-1 and a 40 Watt HPA MMIC circuit 100-2, connected to the combined HPAs 100-3 . . . 100-10. The phase control is provided by a 5 bit MMIC phase shifter PS. Of course, the implementation illustrated in FIG. 4 is intended as an exemplary implementation; other amplifier configuration may alternatively be employed.

Exemplary embodiments of a high power amplifier with selectable outputs have been described. An exemplary embodiment may provide a combination of low power phase shifting elements with high power amplifiers and a low loss waveguide butler matrix to provide high speed, low output loss approach to switching between multiple outputs.

An exemplary architecture of a high power amplifier embodiment may allow for quick switching between multiple outputs by phase adjustment of building block amplifiers. The architecture may support high speed (microsecond) and very high speed (nano-second) switching capability. By locating the phase shifters prior to high power amplification standard high speed phase shifting components may be used. Switching speed performance may not be limited by output power considerations.

An amplifier system with an integrated switch architecture using a combination of phase shifting elements and a butler matrix may result in greater system power efficiency.

Although the foregoing has been a description and illustration of specific embodiments of the invention, various modifications and changes thereto can be made by persons skilled in the art without departing from the scope and spirit of the invention as defined by the following claims.

What is claimed is:

1. An amplifier system, comprising:
    a power divider for diving an input RF signal into M RF signals of equal power and phase;
    M low power selectable phase shifters each for phase shifting one of said M RF signals;
    M high power amplifiers each coupled to one of said phase shifters;
    an M×N power distribution network having M input ports and plural N output ports, and wherein said M high power amplifiers are connected to a respective one of said M input ports of the distribution network; and
    a controller to adjust the phase of the M phase shifters to selectively obtain a maximum output at a desired one of said plural N output ports and a null output at all other outputs of said plural N output ports.

2. The system of claim 1, wherein said M×N power distribution network comprises a butler matrix.

3. The system of claim 2, wherein the butler matrix is a waveguide butler matrix.

4. The system of claim 1, wherein M=N.

5. The system of claim 1, wherein each of said M phase shifters is paired with a corresponding one of said M high power amplifiers as a microwave integrated circuit.

6. The system of claim 1, wherein said input RF signal is an S-band signal, wherein said power divider, said low power selectable phase shifters, said high power amplifiers, and said power distribution network are each configured to operate with said S-band signal.

7. The system of claim 1, wherein said phase shifters are adapted to provide selectable phase shifts in 45° increments.

8. A high power, commutating multiple output amplifier system, comprising:
- an input power splitter for splitting a low power input RF signal M ways, wherein M is an integer value greater than 1;
- M low power variable phase shifters respectively connected to M outputs of the power splitter;
- M high power amplifiers (HPAs) each respectively connected to a corresponding variable phase shifter;
- a reverse butler matrix having M input ports and M output ports; and
- a controller to adjust the phase of the M phase shifters to selectively obtain a maximum output at a desired one of said M output ports and a null output at all other M output ports of said reverse butler matrix.

9. The system of claim 8, wherein the butler matrix is a waveguide butler matrix.

10. The system of claim 8, wherein each of said M phase shifters is paired with a corresponding one of said M high power amplifiers as a microwave integrated circuit.

11. The system of claim 8, wherein said input RF signal is an S-band signal. wherein said input power splitter, said low power variable phase shifters, said high power amplifiers, and said reverse butler matrix are each configured to operate with said S-band signal.

12. The system of claim 8, wherein said phase shifters are adapted to provide selectable phase shifts in 45° increments.

13. A high power, commutating multiple output amplifier system, comprising:
- an input power splitter for splitting a low power input RF signal M ways:
- M low power variable phase shifters respectively connected to outputs of the power splitter;
- M high power amplifiers (HPAs) each respectively connected to a corresponding variable phase shifter;
- a reverse butler matrix having M input ports and M output ports; and
- a controller to adjust the phase of the M phase shifters to selectively obtain a maximum output at a desired one of said output ports and a null output at all other output ports of said butler matrix,
- wherein the butler matrix is a passive circuit including a set of hybrid couplers and fixed phase shifters, and wherein a maximum output may be obtained at any one of said M output ports and a null output at all other output ports by setting the variable phase shifters to a respective one of a plurality of predetermined set of phase shifts, and wherein each of said sets of phase shifts consists of different phase shifts for each variable phase shifter.

14. A switchable, multiple output transmitter system, comprising:
- an input power divider for splitting a low power input RF signal into M signal components of similar phase and amplitude, wherein M is an integer greater than 1;
- M low power variable phase shifters respectively connected to receive one of said M signal components;
- M high power amplifiers (HPAs) each respectively connected to a corresponding variable phase shifter;
- a passive signal distribution matrix having M input ports and M output ports;
- and a controller to adjust the phase of the M phase shifters to selectively obtain a maximum output at any one of said M output ports and a null output at all other output ports of said passive signal distribution matrix.

15. A switchable, multiple output transmitter system, comprising:
- an input power divider for splitting a low power input RF signal into M signal components of similar phase and amplitude;
- M low power variable phase shifters respectively connected to receive one of said M signal components;
- M high power amplifiers (HPAs) each respectively connected to a corresponding variable phase shifter;
- a passive signal distribution matrix having M input ports and M output ports;
- and a controller to adjust the phase of the M phase shifters to selectively obtain a maximum output at any one of said output ports and a null output at all other output ports of said passive signal distribution matrix,
- wherein the passive signal distribution matrix is a butler matrix connected in a reverse orientation, so that signals are simultaneously applied to said M input ports to obtain a maximum output at only one of said output ports while all other output ports have a null output.

16. The system of claim 15, wherein the butler matrix is fabricated in waveguide, and wherein said maximum output is the sum of the output power of all the HPAs less an insertion loss of the butler matrix.

17. The system of claim 14, wherein each of said M phase shifters is paired with a corresponding one of said M high power amplifiers as a microwave integrated circuit.

18. The system of claim 14, wherein said input RF signal is an S-band signal, wherein said input power divider, said low power variable phase shifters, said high power amplifiers (HPAs), and said passive signal distribution matrix are each configured to operate with said S-band signal.

19. The system of claim 14, wherein said phase shifters are adapted to provide selectable phase shifts in 45° increments.

* * * * *

UNITED STATES PATENT AND TRADEMARK OFFICE
CERTIFICATE OF CORRECTION

PATENT NO.         : 7,595,688 B2
APPLICATION NO.    : 11/981159
DATED              : September 29, 2009
INVENTOR(S)        : Gandhi et al.

It is certified that error appears in the above-identified patent and that said Letters Patent is hereby corrected as shown below:

Column 4, line 52, "diving" should read --dividing--

Signed and Sealed this

Twenty-first Day of September, 2010

David J. Kappos
*Director of the United States Patent and Trademark Office*